United States Patent [19]
Chiari

[11] Patent Number: 5,705,020
[45] Date of Patent: Jan. 6, 1998

[54] DEVICE FOR CONTROLLING THE PRODUCTION QUALITY OF A PRESS THAT PRODUCES PACKAGE BLANKS FROM SHEETS OF MATERIAL

[75] Inventor: Mauro Chiari, Lausanne, Switzerland

[73] Assignee: Bobst SA, Lausanne, Switzerland

[21] Appl. No.: 491,151

[22] Filed: Jun. 16, 1995

[30] Foreign Application Priority Data

Jun. 17, 1994 [CH] Switzerland ............ 01917/94

[51] Int. Cl.⁶ ............................................. B32B 31/00
[52] U.S. Cl. ............................ 156/350; 156/356; 156/362; 156/378; 156/379; 156/517; 271/258.01; 271/265.01
[58] Field of Search ................................. 156/350, 353, 156/356, 362, 363, 364, 378, 379, 510, 517; 271/258.01, 265.01

[56] References Cited

U.S. PATENT DOCUMENTS 4,547,250 10/1985 Murayama .................. 156/384
4,855,838 8/1989 Jones et al. ................. 358/229
4,863,551 9/1989 Ogura ......................... 156/378
4,904,318 2/1990 Goto et al. .................. 156/379 X
4,934,228 6/1990 Bolton et al. ................ 156/378 X

*Primary Examiner*—David A. Simmons
*Assistant Examiner*—Paul M. Rivard
*Attorney, Agent, or Firm*—Hill, Steadman & Simpson

[57] ABSTRACT

A device for controlling the production quality of a press, which manufactures package blanks from a sheet of material by transferring the sheet of materials, such as paperboard or corrugated board, chronologically through an infeed station, a die-cutting station, a waste-stripping station and a delivery station, has an arrangement for controlling the printing and blanking quality which includes a camera scanning the color register marks and a register mark for the positioning of the blanking of the sheet. The camera is located at the outlet of the die-cutting station so that it can scan the marks applied on the lower side of the sheet. The device includes a marking device, which is driven by the arrangement for controlling the printing and blanking quality, to mark a defective sheet and is positioned in the delivery station of the press.

12 Claims, 6 Drawing Sheets

DEVICE FOR CONTROLLING THE PRODUCTION QUALITY OF A PRESS THAT PRODUCES PACKAGE BLANKS FROM SHEETS OF MATERIAL

BACKGROUND OF THE INVENTION

The present invention is directed to a device for controlling the production quality of a press that manufactures packages, and specifically for controlling the production quality of a press that manufactures paperboard or corrugated board blanks for forming packages.

The man skilled in the art knows of devices for controlling the production quality of a press that manufactures packages, which uses a camera associated with an image processing device in order to detect and memorize the position of alignment elements, which are located on the front waste of a sheet out of which the package blanks are die-cut. This front waste is separated from the sheet, then passes in the optical field of the camera and is finally removed, for instance, on a conveyor belt. In this device, the front edge of a sheet taken from a pile is introduced in a gripper bar which is carried by a pair of continuous chain conveyors. The sheet is then carried through several working stations of the press. After the delivery station of the press, the only thing remaining in the gripper bar is the front waste of the sheet, and the front waste is then removed from the gripper bar in an area located on an upward or return run of the continuous chain conveyor and is removed from the machine by means of a conveyor belt. It should be reminded that every operation is achieved when the gripper bars are at a standstill or during a dwell in the movement of the conveyor.

At a standstill of the gripper bar which occurs after the delivery station but before the standstill for the removal of the front waste, a camera is located above and opposite the front waste. The waste has an area with a series of perforations, and these perforations are arranged along two diagonal lines.

Five color register marks will have been printed in a known manner very close to the perforations, with every mark corresponding to one of the five printing units of a flexographic priming machine. Thus, every mark corresponds to one color. A number of marks higher or lower than five can obviously be envisioned, depending on the number of printing units being used.

So that the camera may read the register marks with sufficient accuracy, security and quickness, the following conditions should be preferably fulfilled:

- the marks have to be aligned along the lengthwise axis of the waste passing through the central point of the perforations;
- squares or rectangles are not considered as marks;
- a minimum space is required between every mark;
- every mark has a height and a width of 3 mm to 6 mm; and
- the disposition of the five marks with regard to the perforations should be such that the marks and the perforations are in a unique vision field of the camera.

The function of the camera is, thus, to read, simultaneously, the five marks and the perforations when the waste is at a standstill. For every scanning, the waste is illuminated by means of a flash of light, whose control is synchronized with one of the die-cutting machines. The flash of light allows reducing the ambient causes of error of scanning inexactitude, such as, for instance, the vibration of the waste in the chain conveyor direction, to a minimum. The flash of light can be replaced by a continuous light with a controlled exposure time.

An example of this device is disclosed in Swiss Patent Application 00948/93-4 of Mar. 29, 1993.

One of the main drawbacks of this kind of device remains in the fact that the detection of a defective sheet occurs once the sheet has already been piled in the delivery station of the press and several sheets are already covering it. This fact will imply a requirement for sorting the delivered pile in order to remove the defective sheet, which can only be achieved by examining carefully all of the last sheets of the pile. Another possibility offered by this kind of device consists in stopping the press as soon as the defective sheet has been detected. These press standstills can be frequent and detrimental to the production output due to this standstill. Moreover, the detection of the defective sheet among the other sheets in the pile, which have no particular marks, will be difficult.

SUMMARY OF THE INVENTION

The present invention is directed to eliminating the above-mentioned drawbacks. These objects are achieved by an improvement in a device for controlling the production quality of a press that manufactures packages by die-cutting package blanks from sheets of paperboard or corrugated board and includes, in chronological order, an infeed station, a die-cutting station, a waste-stripping station and a delivery station. The device has means for checking the production of the press and controlling the printing and blanking quality and the means include a camera for scanning colored register marks and a register mark for the position of the blanking of the sheets. The improvement is that the camera is located at the outlet of the die-cutting station so that it can scan the marks applied on a lower side of the sheet and by the fact that the device includes a marking device actuated by the means for controlling the printing and blanking quality to mark a defective sheet when it arrives in the delivery station of the press.

Other advantages and features of the invention will be readily apparent from the following description of the preferred embodiments, the drawings, and the claims.

DESCRIPTION OF THE PREFERRED EMBODIMENTS

Figure 1:
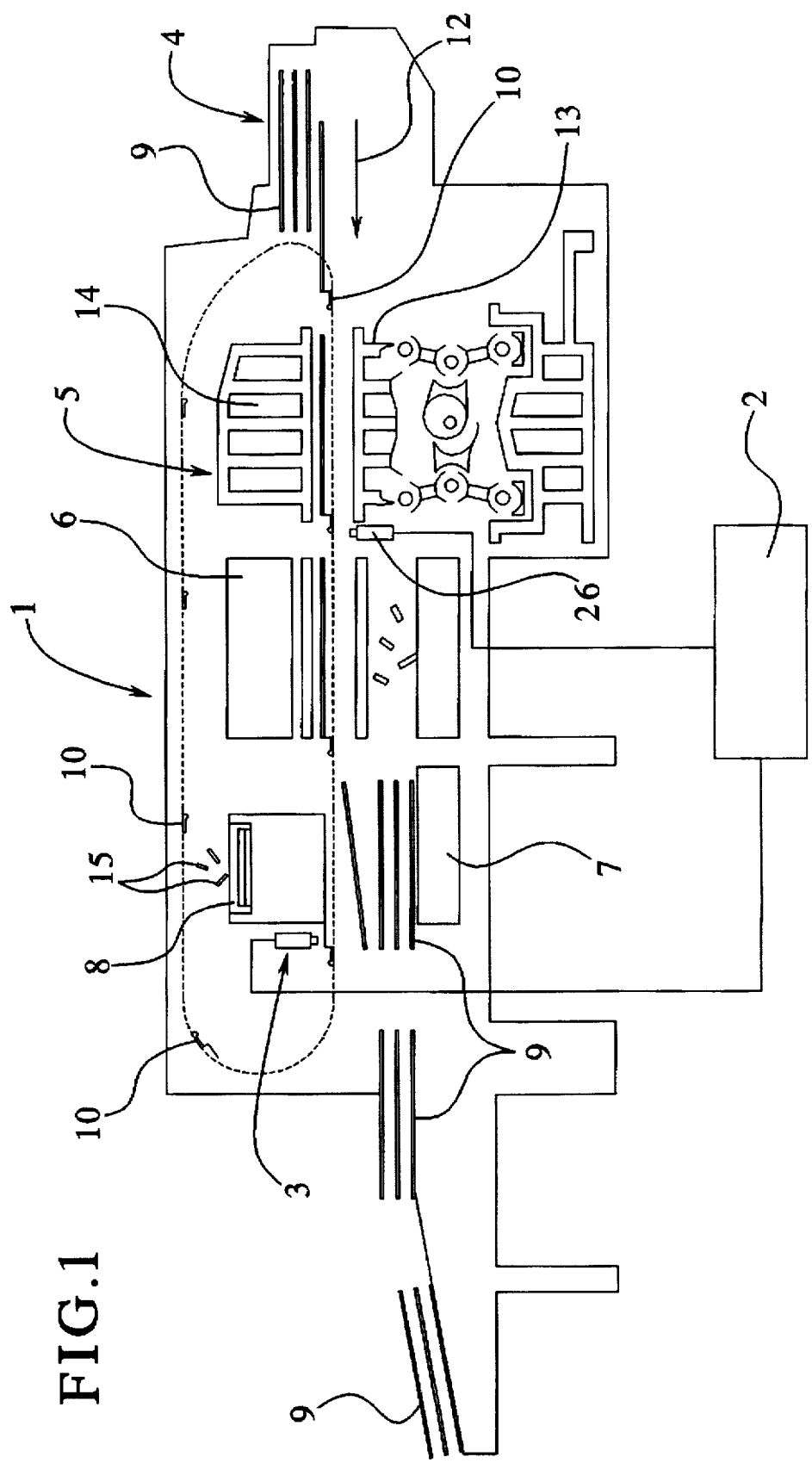
FIG. 1 is a diagrammatic side view of a press for manufacturing blanks for forming packages from a sheet with various stations of the press illustrated in simple block diagram form.

The principles of the present invention are particularly useful when incorporated in a press, generally indicated at 1 in FIG. 1. The press 1 is provided with means for controlling the printing and blanking quality indicated by a box 2. The press 1 is for manufacturing blanks for forming packages in a sheet of material and includes an infeed station 4, a die-cutting station 5, a waste-stripping station 6 and a delivery station 7, which station 7, on an upper portion, has a conveyor belt 8 designed to remove a front waste 15 of the sheet processed in the die-cutting machine from the press. The cardboard sheets 9 are to be processed or carried through the machine by means of a gripper bar 10 which is mounted on a chain conveyor 11, which has a lower run that moves in a direction of arrow 12.

Usually, the die-cutting station 5 includes a lower beam 13 on which a die-cutting counter-tool is fitted and a stationary upper beam 14, which has a lower side on which the die-cutting tools are mounted. In order to be able to spot the front waste 15 (see FIGS. 2 and 3) with regard to various folded box blanks die-cut by the die-cutting tool, a punch 16 (see FIG. 5) is provided and is located in the medium lengthwise axis of the machine in the area corresponding to the position of the front waste 15. This punch 16 is preferably mounted in a die-cutting tool and works jointly with a matrix 17 arranged in a die-cutting counter-tool. A bore 18 for the removal of the punched waste bits is illustrated in the lower beam 13. Thus, every time a die-cutting operation takes place, the front waste will be marked by a punch 16 with a perfect registry between the die-cutting tool and the front waste 15. In the chosen example, the punch 16 and the matrix 17 are circular and will form perforations, such as 23 in FIGS. 2 and 3.

Figure 4:
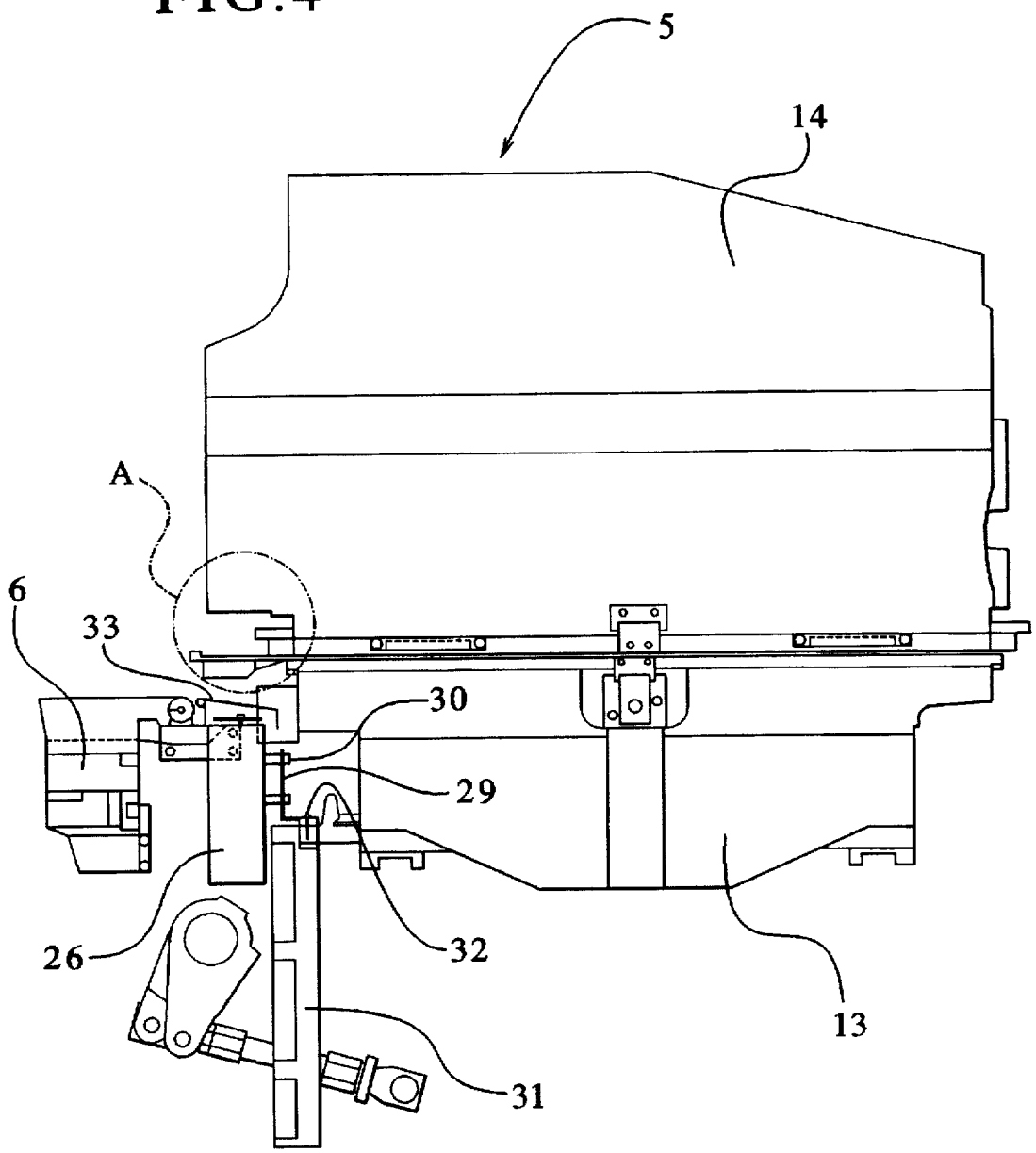
FIG. 4 is an enlarged side view of the die-cutting station showing the position of the camera for determining the quality of the sheet being die-cut.

The means 2 for controlling the printing and blanking quality includes a camera 26 located at the outlet of the die-cutting station 5 (see FIGS. 1 and 4) so that it may scan the marks applied on the lower side of the sheet 9 when the latter moves. Such a scanning is known in the above-mentioned Swiss Application, but the scanning occurs in a different area of the press for the manufacturing of blanks for packages and when the front waste is at a standstill. The means 2 for controlling the printing and blanking quality is of a conventional structure and is the type used in the above-mentioned Swiss Application. In the scanning, if an error is detected from the desired position for the marks, either an error signal or a stop signal will be provided, and this signal is used in the present invention to actuate a marking device 3, which will be discussed hereinafter.

Figure 2:
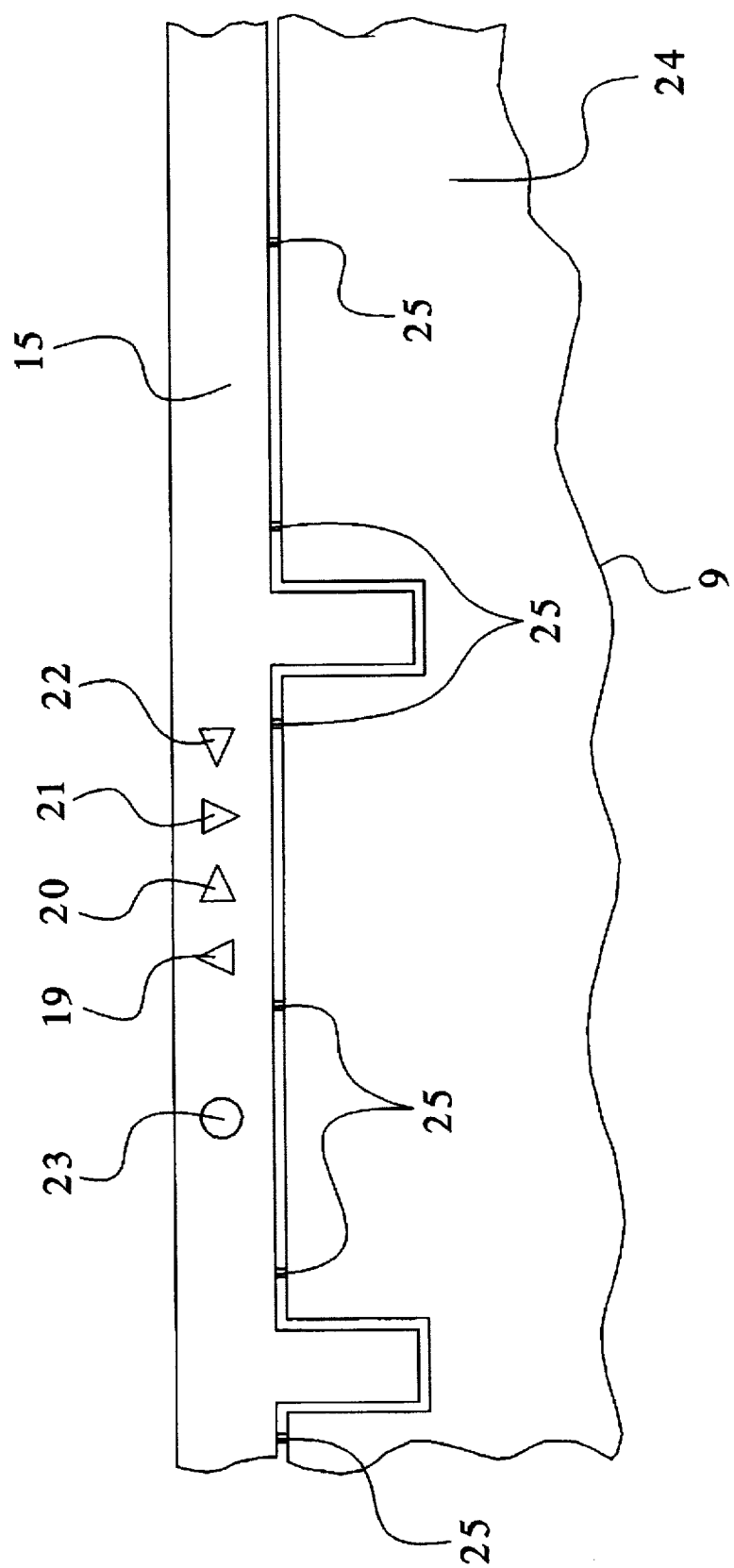
FIG. 2 is a partial lower plan view of a from waste portion of a sheet having color register marks and a register mark for the positioning of the blanking subsequent to being in a die-cutting station.
Figure 3:
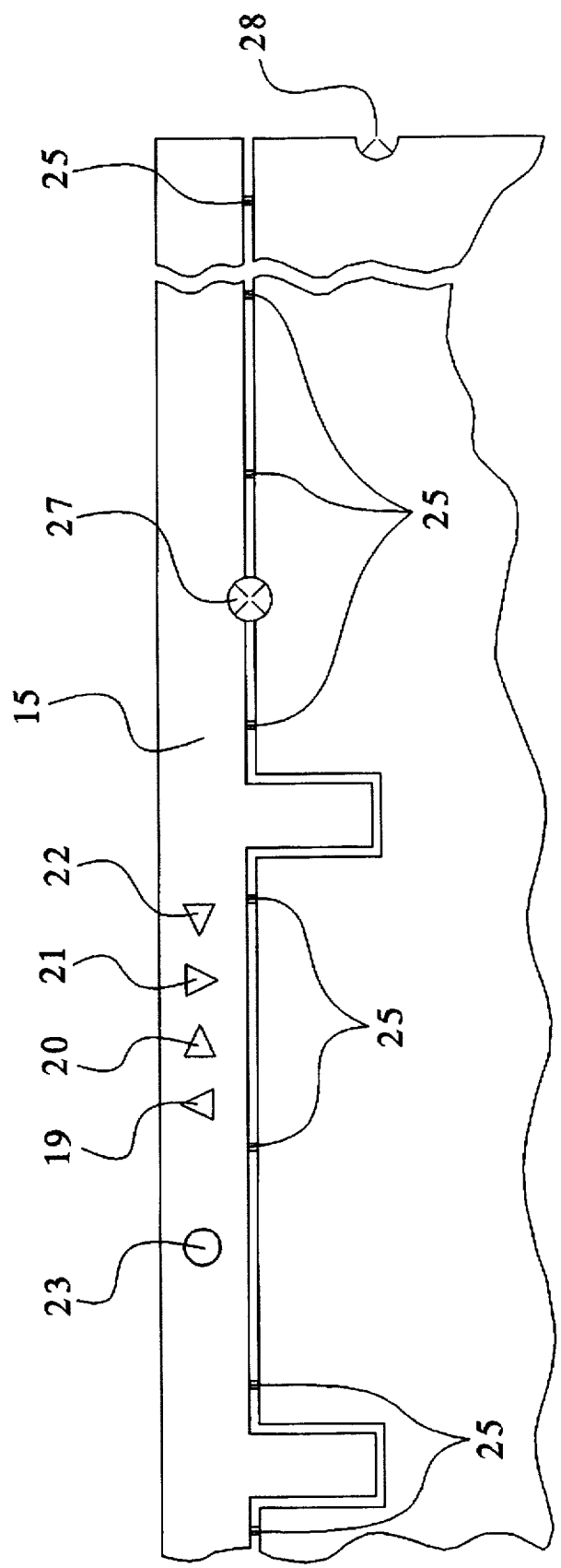
FIG. 3 is a plan view similar to FIG. 2 of a front lower part of a sheet coming from the die-cutting station, whose front waste is provided with the color register mark and a register mark for the positioning of the blanking which consists of perforations made by a punch and the sheet bearing an identification imprint.

As illustrated in FIGS. 2 and 3, the from part of a sheet 9, coming from the press that manufactures packages, will have a front waste 15 which is provided with color register marks 19–22 on a lower or bottom surface and a register mark for the positioning of the blanking which consists of a perforation 23 made by the punch 16. In FIG. 2, the various blanks 24 of the sheet 9 are represented in a simplified manner and are linked to the front waste 15 by means of bridges or nicks 25. These various marks 19–22 appear on the lower surface of the sheet and will be scanned by the camera 26.

In FIG. 3, the sheet 9 coming from the press, that manufactures the packages, has a front waste 15 which is provided with register marks 19–22 and a register mark for the positioning of the blanking, which consists of the perforation 23 made by the punch 16. In addition, the sheet 9 bears identification imprints 27 and 28. As it comes out of this Figure, the identification imprints can be achieved either by perforating an area situated between the from waste 15 and the blank 24 (see imprint 27) or by perforating an area situated at one of the lateral edges of the sheet 9 (see imprint 28). In either case, once the waste 15 is separated from the sheet, a sheet edge will have a notch to indicate that the sheet is defective. This manner of identifying the defective sheet 9 allows an easy spotting of the defective sheet in a pile, because the identification mark is very visible when one looks at the pile side corresponding to the area chosen for the marking.

As mentioned above, the camera 26 for quality control is located at the outlet of the die-cutting station. The camera 26 for quality control is mounted on a support 29, which can be shifted laterally to the sheet-travelling direction in the die-cutting machine 1 so that the camera's position can be adjusted according to the location of the color register marks and of the die-cutting register mark of the sheet 9. The support 29 is mounted on a tightening jaw 31 of the die-cutting station 5 by means of screws 32, which engage in a nut arranged in a dovetail-shaped groove. In order to not let the cardboard dust accumulate on the lens of the camera 26, a transparent protective sheet 33 has been provided above the lens which will continuously be cleaned by the air currents that are caused by the passage of the sheet 9 in the press that is manufacturing the blanks.

Figure 5:
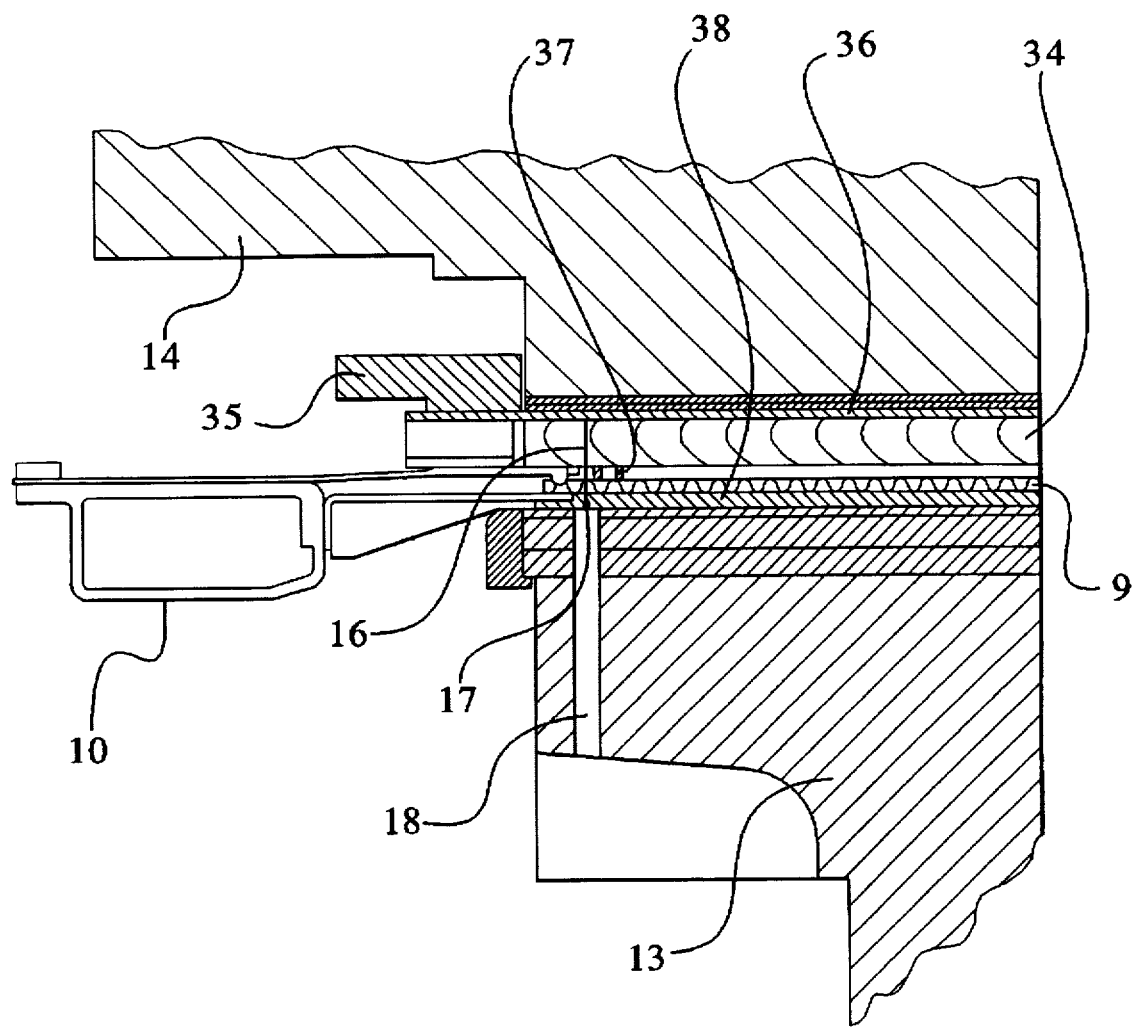
FIG. 5 is an enlarged cross sectional view taken in the location of circle A of FIG. 4.

As best illustrated in FIG. 5, the punch 16 is mounted in a block which is inserted by means of screws in the die-cutting tool 34, which, itself, is mounted by means of a fastening element 35 on the lower side of the fixed upper beam 14. A steel protection plate 36 covers the upper part of the die-cutting tool. In order to increase the function of the punch 16, it is associated with a foam rubber presser 37 glued on a lower side of the die-cutting tool 34. Thus, the sheet will be held when the punch engages in the matrix 17 arranged in the counter-tool 38 to form the perforation.

Figure 6:
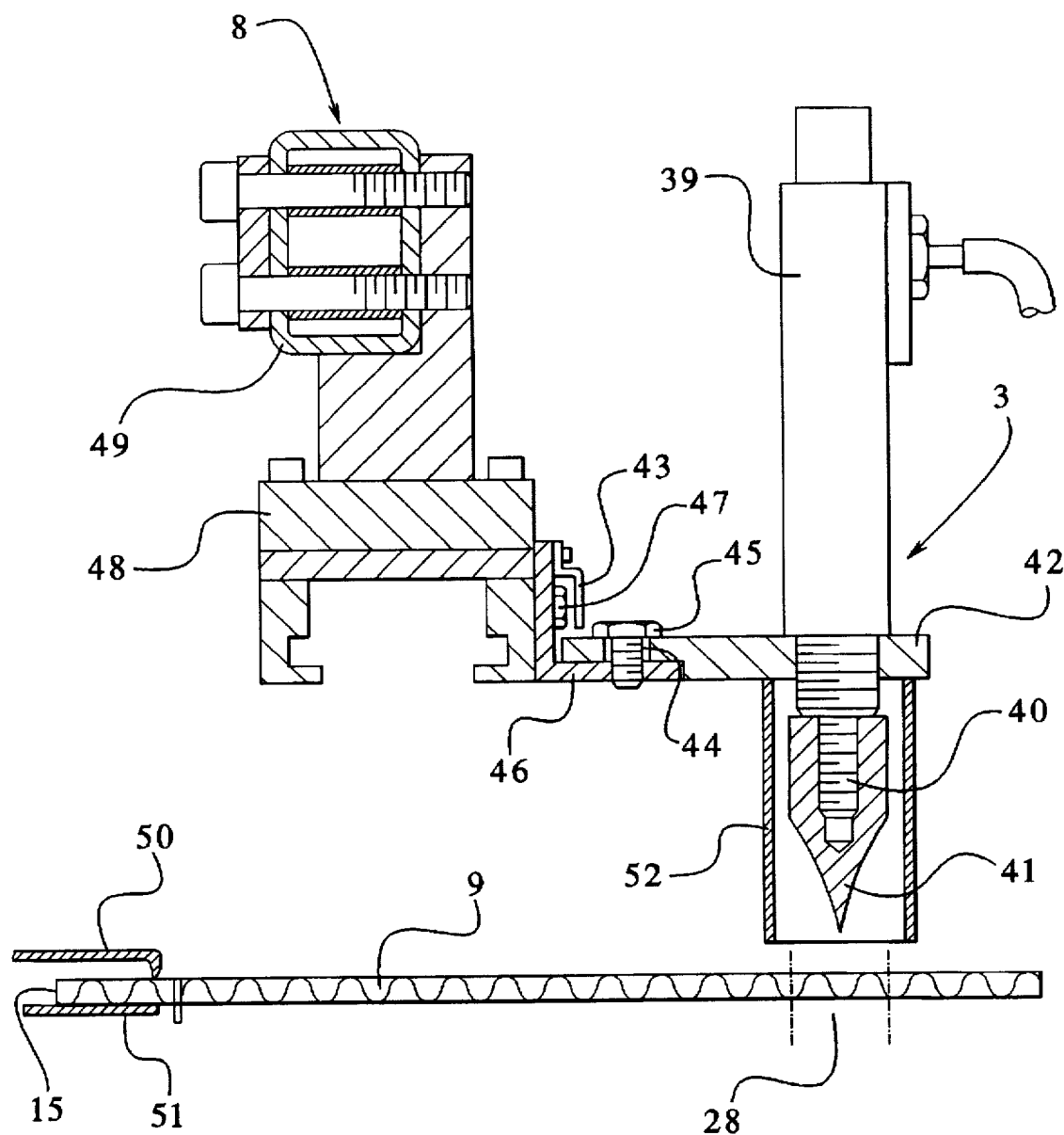
FIG. 6 is a cross sectional view with portions in elevation of a marking device for defective sheets.

The marking means 3 is best illustrated in FIG. 6. The marking means includes a pneumatic cylinder 39, whose piston rod 40 is equipped with a perforator or punch 41. The perforator 41 is protected by an envelope 52 which is welded on the lower side of a support plate 42. Preferably, the punch 41 will be cone-shaped. The punch 41 will even have, in its conic part, a cutting lip which will provide a better identification imprint 27 or 28 of FIG. 3. The pneumatic cylinder 39 is mounted by threads in the fastening plate 42, which is adjustably mounted in a lateral position according to the width of the size of the sheet 9 being processed by the press 1. This setting can be achieved by means of a graduated guide strip engraved on the fastening plate 42 and by an indicator 43. The fastening plate 42 has oblong holes or slots 44 which receive blocking screws 45 so that it may be able to shift the marking element 3 into the desired position. The blocking screws 45 keep the fastening plate 42 on an angle iron 46 which is mounted by means of screws 47 on one of the sides of a support 48 which belongs to an upper frame member 49 of a device (not illustrated in greater detail) for removing the front waste 15 which, in this Figure, is still in the jaws 50 and 51 of the gripper bar 10. Thus, the marking element 3 will follow a vertical movement of the sheet 9 after it has been separated from its front waste 15 and, in the case of a defective sheet 9, the pneumatic piston will be actuated by the quality control means 2 and the perforator 41 will make an identification mark 28 on the corresponding edge of the sheet. As has already been mentioned with regard to FIG. 3, the marking element could be situated so that the identification mark will be applied on another area of the sheet 9, for instance between the front waste 15 and the blanks 24.

One could envision to replace the marking element 3, which has a perforator 41, by a nozzle which would splash an ink sensitive to ultra-violet rays on an edge of a defective sheet 9. Then, the ink could be detected by means of a light source. Another possibility consists in using a marking device 3 which, on one of the lateral edges of the defective sheet 9, would glue or attach a strip which would facilitate the spotting of the defective sheet in a pile made by the delivery station 7 of the press 1 that manufactures these sheets.

The advantages of such a device remain in the fact that it is not necessary to stop the press 1, which manufactures the sheet, during the spotting of a defective sheet. The defective sheet is easily detected and removed from the pile after the pile is formed by the delivery station of the machine.

Although various minor modifications may be suggested by those versed in the art, it should be understood that I wish to embody within the granted hereon all such modifications as reasonably and properly come within the scope of my contribution to the art.

I claim:

1. In a device for controlling the production quality of a press that manufactures package blanks from sheets by conveying a sheet of material in a chronological order through an infeed station, a die-cutting station, a waste-stripping station and a delivery station for forming a stack of die-cut sheets, the production of said press being checked by means for controlling the printing and blanking quality which include a camera for the scanning of color register marks and a register mark for the positioning of the blanking, the improvements comprising said camera being located at an outlet of the die-cutting station so that it can scan the marks applied on the lower side of the sheet and said device having means for marking an edge of a sheet actuated by the means for controlling the printing blank quality in response to the detecting of a defective sheet so that the deflective sheet can be located in said stack of die-cut sheets.

2. In a device according to claim 1, wherein the camera is mounted on an outlet of the die-cutting station by adjustable mounting means so that it may be shifted laterally depending on the location of the register marks applied on a lower side of the sheet.

3. In a device according to claim 1, wherein the register mark for the positioning of the blanking is achieved by a punch mounted in a die-cutting tool of the press that is processing the sheets, said punch coacting with a matrix arranged in a die-cutting counter-tool of the die-cutting station.

4. In a device for controlling the production quality of a press that manufactures package blanks from sheets by conveying a sheet of material in a chronological order through an infeed station, a die-cutting station, a waste-stripping station and a delivery station, the production of said press being checked by means for controlling the printing and blanking quality which include a camera for the scanning of color register marks and a register mark for the positioning of the blanking, the improvements comprising said camera being located at an outlet of the die-cutting station so that it can scan the marks applied on the lower side of the sheet and said device having means for marking a sheet actuated by the means for controlling the printing blank quality in response to the detecting of a defective sheet, said means for marking having a pneumatic cylinder having a rod connected to a perforator, said cylinder being mounted on a fastening plate adjusted laterally so as to adjust the position of the marking means according to the size of the sheet to be processed and by the fact that the marking means is arranged so as to follow the vertical movement of the lower frame of a device for removing front waste from a sheet.

5. In a device according to claim 4, wherein the marking means makes an identification imprint on one of the lateral edges of the defective sheet.

6. In a device according to claim 4, wherein the marking means makes an identification imprint in an area situated between a front waste and a blank of the sheet.

7. In a device for controlling the production quality of a press that manufactures package blanks from sheets by conveying a sheet of material in a chronological order through an infeed station, a die-cutting station, a waste-stripping station and a delivery station, the production of said press being checked by means for controlling the printing and blanking quality which includes a camera for the scanning of color register marks and a register mark for the positioning of the blanking, the improvements comprising said camera being located at an outlet of the die-cutting station so that it can scan the marks applied on the lower side of the sheet and said devices having means for marking a sheet actuated by the means for controlling the printing blank quality in response to the detecting of a defective sheet, said means for marking consisting of a nozzle which splashes an ink sensitive to ultra-violet rays on only an edge of the defective sheet.

8. In a device according to claim 1, wherein the marking means consists of an element which applies a strip on the lateral edges of the defective sheet.

9. In a device according to claim 4, wherein the camera is mounted on an outlet of the die-cutting station by adjustable mounting means so that it may be shifted laterally depending on the location of the register marks applied on a lower side of the sheet.

10. In a device according to claim 4, wherein the register mark for the positioning of the blanking is achieved by a punch mounted in a die-cutting tool of the press that is processing the sheets, said punch coacting with a matrix arranged in a die-cutting counter-tool of the die-cutting station.

11. In a device according to claim 7, wherein the camera is mounted on an outlet of the die-cutting station by adjustable mounting means so that it may be shifted laterally depending on the location of the register marks applied on a lower side of the sheet.

12. In a device according to claim 7, wherein the register mark for the positioning of the blanking is achieved by a punch mounted in a die-cutting tool of the press that is processing the sheets, said punch coacting with a matrix arranged in a die-cutting counter-tool of the die-cutting station.

* * * * *